United States Patent
Soman et al.

(10) Patent No.: US 7,019,677 B1
(45) Date of Patent: Mar. 28, 2006

(54) CURRENT STEERING DIGITAL TO ANALOG CONVERTERS WITH SELF-CALIBRATION, AND SYSTEMS AND METHODS USING THE SAME

(75) Inventors: Manoj Shridhar Soman, Pune (IN); Krishnan Subramoniam, Austin, TX (US); Rajendra Datar, Pune (IN)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/936,997

(22) Filed: Sep. 8, 2004

(51) Int. Cl.
*H03M 1/66* (2006.01)
(52) U.S. Cl. .................................................. 341/144
(58) Field of Classification Search ................ 341/120, 341/145, 118, 144, 121, 13, 150, 156; 323/314, 323/315, 313, 907; 327/538, 539, 540, 512
See application file for complete search history.

(56) References Cited

U.S. PATENT DOCUMENTS

| | | | | |
|---|---|---|---|---|
| 4,458,201 A | * | 7/1984 | Koen | 323/317 |
| 6,738,000 B1 | * | 5/2004 | Boxho | 341/120 |
| 6,828,847 B1 | * | 12/2004 | Marinca | 327/513 |

OTHER PUBLICATIONS

Tiilikainen, Mika P., A 14-bit 1.8V 20-mW 1mm2 CMOS DAC, IEEE Journal of Solid State Circuits, vol. 36, No. 7, Jul. 2001, pp 1144-1147.
Marques et al., A 12b Accuracy 300MSample/s Update Rate CMOS DAC, ISSCC Dig. Technical Papers, Feb. 1998.
Vandenbussche et al., A 14b 150 MSample/s Update Rate Q2 Random Walk CMOS DAC, ISSC Dig. Technical Papers, Feb. 1999.

* cited by examiner

*Primary Examiner*—Brian Young
(74) *Attorney, Agent, or Firm*—James J. Murphy; Thompson & Knight, LLP

(57) ABSTRACT

A current steering digital to analog converter includes a current source for selectively providing a selected amount of current to an output in response to input data. The current source includes a selected number of sub-current sources for selectively providing fractions of the selected amount of current to the output. Compensation current sources each provide a selected amount of compensation current to the output. Compensation control circuitry, in response to the input data, selectively activates and de-activates selected ones of the sub-current sources and the compensation current sources to provide current compensation at the output.

24 Claims, 8 Drawing Sheets

CURRENT STEERING DIGITAL TO ANALOG CONVERTERS WITH SELF-CALIBRATION, AND SYSTEMS AND METHODS USING THE SAME

FIELD OF INVENTION

The present invention relates in general to digital to analog conversion techniques, and in particular, segmented current steering digital to analog converters with self-calibration, and systems and methods using the same.

BACKGROUND OF INVENTION

High performance digital to analog converters (DACs), such as those utilized in digital video encoder systems, typically must support a digital input resolution of twelve (12) or fourteen (14) bits, and clocks speeds In excess of 100 MHz. One very popular DAC architecture, utilized in such high performance applications, is the segmented current steering DAC. Generally, in a segmented current steering DAC, current elements are partitioned into segments, with at least one of the segments controlled by thermometer-encoded data, such that within that segment, the current elements are equally weighted. Advantageously, thermometer encoding and equally weighted current elements help minimize some types of non-linearities.

On the other hand, segmented current steering DACs require a significant amount of chip area. For example, fifteen (15) thermometer-encoded bits are required to represent four (4) binary bits. Hence, a current steering segment converting four (4) binary bits into an analog signal, after thermometer encoding, requires fifteen (15) current elements.

Additionally, most conventional high resolution DACs require that a much higher unit cell area be utilized during device fabrication to reduce random mismatch, and/or sophisticated cell randomization circuitry to reduce gradient mismatch errors. The result is an increase in device chip area and increased circuit complexity. A few reported DACs use calibration methods which are complex and consume high silicon area.

Given the importance of reducing chip-area in order to fabricate economical and efficient DACs, new techniques are required for performing on-chip calibration to compensate for differences between current steering cells in current steering DACs. These techniques also should not significantly increase the overall area and complexity of the embodying DAC, without adversely impacting performance. In particular, these techniques should be particularly applicable to high-resolution segmented current steering DACs, although not necessarily limited thereto.

SUMMARY OF INVENTION

The principles of the present invention are embodied in circuits and methods from compensating for output current errors in current steering DACs. In one particular embodiment, a current steering digital to analog converter is disclosed which includes a current source for selectively providing a selected amount of current to an output in response to an input bit. The current source includes a selected number of sub-current sources for selectively providing fractions of the selected amount of current to the output. Compensation current sources each provide a selected amount of compensation current to the output. Compensation control circuitry, in response to the input data and a stored pre-calculated compensation value, selectively activates and de-activates selected ones of the sub-current sources and the compensation current sources to provide current compensation at the output.

The principles of the present invention realize a number of significant advantages, especially when applied to segmented current steering DACs. For example, the additional analog and digital circuitry required to implement the inventive calibration techniques are low in complexity. Additionally, existing current sources within a current steering DAC are reused, further minimizing the overall size and complexity of the DAC. To further reduce chip-area, the channel width and channel length of the various cells are selected to provide the required currents, while minimizing the sizes of the corresponding current sources. Furthermore, no complex real-time correction computations must be executed. Moreover, calibration circuitry embodying the present invention may be shared across several DACs on chip, if needed. In sum, circuits, systems, and methods embodying the principles of the present invention are both operationally and chip-area efficient.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–4 of the drawings, in which like numbers designate like parts.

Figure 1:
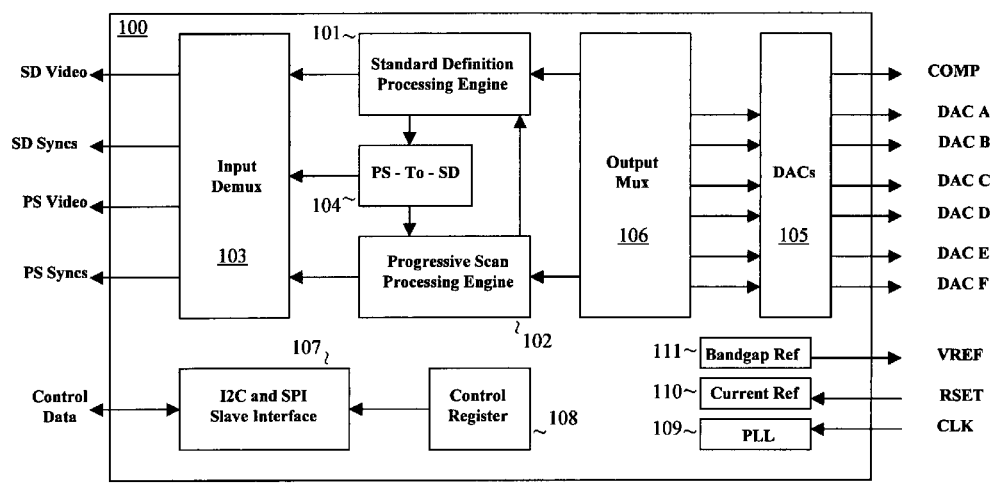
FIG. 1 is a high level block diagram of a representative video encoder suitable for describing the principles of the present invention.

FIG. 1 is a diagram of an exemplary single-chip video encoder 100 suitable for describing the principles of the present invention. Video encoder 100 includes a standard definition processing engine 101 and a progressive scan-processing engine 102.

Standard definition processing engine 101 receives standard definition input data (SD VIDEO) and associated synchronization signals (SD SYNCS), through input demultiplexer (demux) 103, in either of the CCIR-601 or CCIR-656 International Radio Consultative Committee standard formats, and outputs either National Television Systems Committee (NTSC), phase alternation line (PAL), or red-blue-green (RGB) format video data. Progressive scan processing engine 102 inputs either 4:2:2: or 4:4:4 YCbCr format video data (PS VIDEO) and associated synchronization signals (PS SYNCS) through demux 103, and outputs video data in either of the YPbPr or RGB video formats. An internal progressive scan to standard definition (PS-to-SD) converter 104 supports the conversion of progressive scan video data into standard definition video data for processing by standard definition processing engine 101.

Video encoder 105 includes a block of six (6) digital to analog converters (DACS) 105, which supports various output configurations. Depending on the output configuration, an output multiplexer (mux) 106 switches the video data from either standard definition processing engine 101 and/or progressive scan processing engine 102 to the required DACs of DAC block 105.

Control of video encoder 100 is implemented through an I2C and SPI interface 107 and control register 108. Timing is implemented on-chip with a phase-locked loop (PLL) 109 in response to a received clock signal CLK. Video encoder also includes a current reference 110 and a bandgap reference 111 for generating a reference voltage VREF.

FIG. 2 is a block diagram of an exemplary segmented current steering DAC 200 according to the principles of the present invention. DAC 200 is particularly suitable for utilization in DACs 105 of video encoder 100 of FIG. 1, although there are numerous other applications of current steering DACs embodying the inventive concepts.

In the illustrated embodiment, DAC 200 is a fourteen-bit current steering DAC which is segmented into a most significant bits (MSB) segment 201 representing four (4) binary input bits, a mid-range (significant) bits (MID) segment 202 representing four (4) mid-range (significant) binary input bits, a least significant bits (LSB) segment 203 representing two (2) least significant binary input bits, and a fourth segment 204 representing two (2) least significant input bits and two (2) fractional binary input bits, along with a one-half calibration bit. The number of binary input bits, N, may change from the fourteen (14) utilized in the present example, depending on the desired resolution of DAC 200.

Figure 2A:
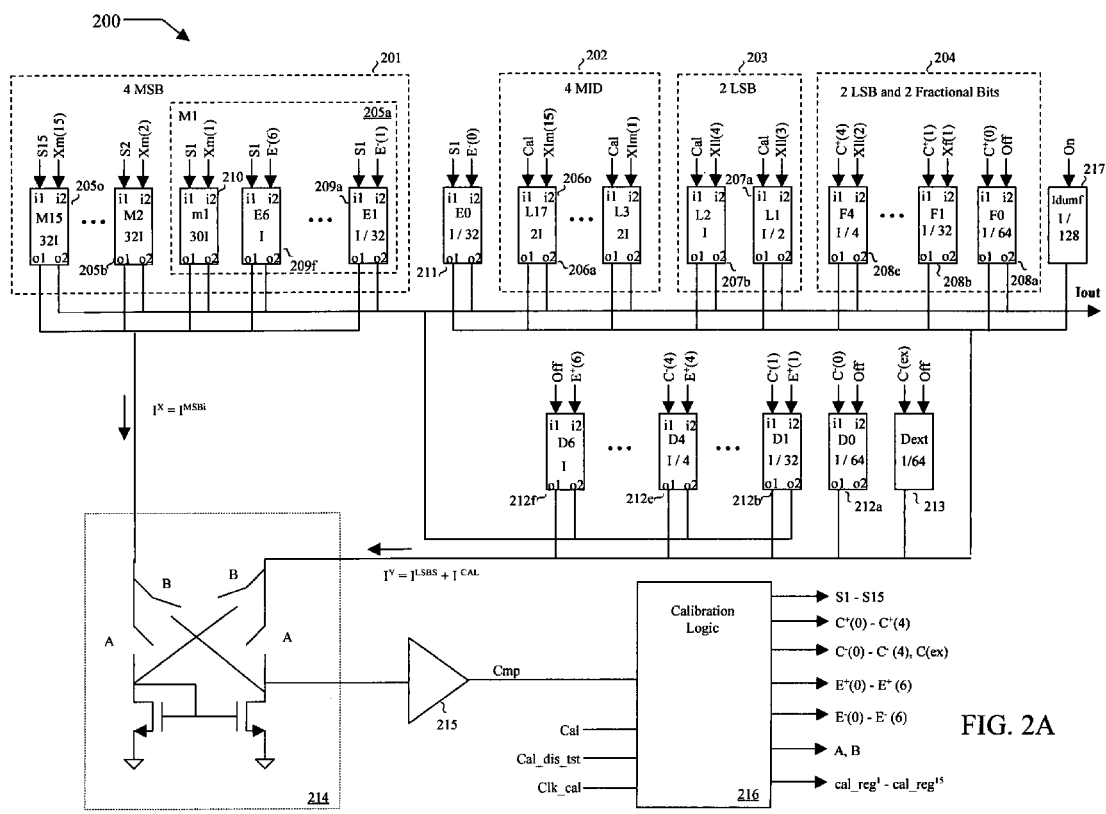
FIG. 2A is a block diagram of an exemplary segmented current steering DAC with calibration embodying the principles of the present invention and suitable for utilization in the DACs shown in FIG. 1.
Figure 2B:
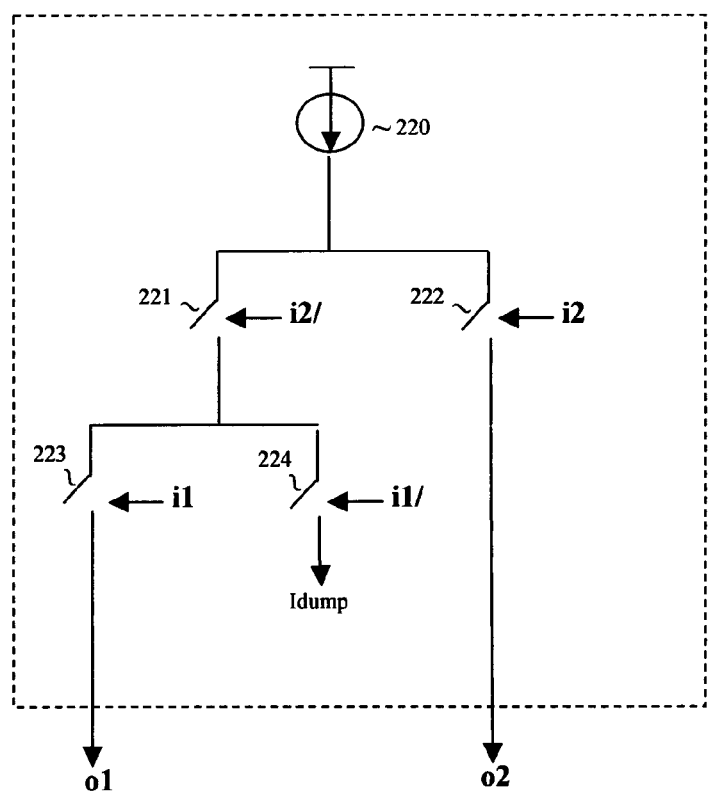
FIG. 2B is an electrical schematic generally illustrating the structure of the current cells shown in FIG. 2A.
Figure 2C:
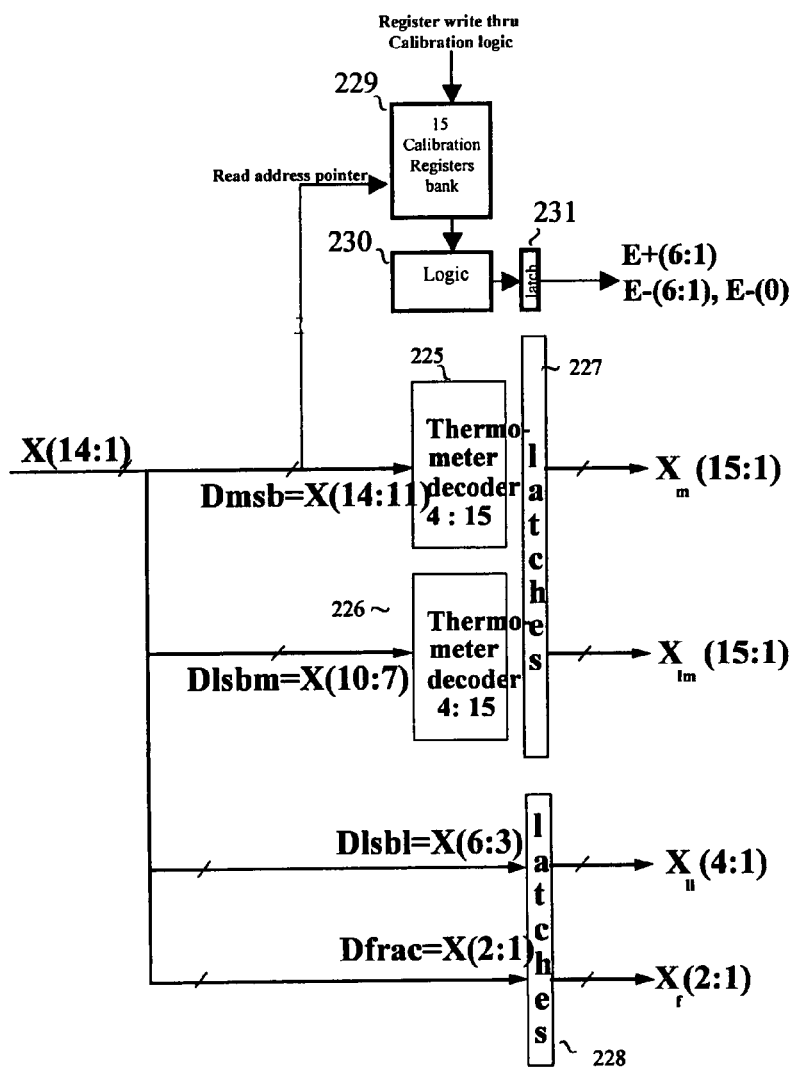
FIG. 2C is conceptual block diagram generally describing the conversion of binary most significant bits (MSBs) and mid-significant bits (MID) into thermometer-encoded bits for presentation to the inputs of the DAC of FIG. 2A.

MSB segment 201 includes fifteen (15) equally-weighted current sources (M1–M15) 205a–205o. Each MSB current source 205a–205o is controlled by one (1) of fifteen (15) thermometer encoded bits $X_M(0)$–$X_M(15)$, and outputs a nominal current 32I, in which I is a selected unit reference current. In the illustrated embodiment, each MSB current source 205a–205o is fabricated from a MSB unit cell UcellM, in which UcellM generates sixteen (16) times the current of the LSB unit cell UcellL, discussed below. FIG. 2C generally illustrates the conversion of four (4) binary bits $D_{MSB}$ into fifteen (15) thermometer encoded bits $X_M(0)$–$X_M(15)$. During calibration, MSB current sources 205a–205o are controlled by the corresponding control signals S1–S15.

In FIG. 2C, the four (4) binary input MSBs, $D_{MSB}$, are thermometer encoded by thermometer encoder 225 into fifteen (15) thermometer-encoded bits $X_M(1)$–$X_M(15)$. Similarly, the four (4) binary input mid-range bits, $D_{LSMB}$ are thermometer encoded by thermometer encoder 226 into fifteen (15) thermometer-encoded bits $X_{LM}(1)$–$X_{LM}(15)$. The thermometer-encoded bits $X_M(1)$–$X_M(15)$ AND $X_{LM}(3)$–$X_{LM}(17)$ are latched in a set of latches 227. The four (4) binary LSB input bits Dlsbl and two (2) binary fractional bits $D_{FRAC}$, are directly latched in latches 228 as bits $X_{LL}(1)$–$X_{LL}(4)$ and $X_F(1)$–$X_F(2)$, respectively. A register 229, indexed by bits $D_{MSB}$, stores correction values CAL_REG, discussed in detail below. In conjunction with logic 230 and latch 231, the indexed value of CAL_REG generates a set of control signals $E^+(1)$ $^{to}$ $E^+(6)$ and $E^-(0)$ to $E^-(6)$.

Figure 3A:
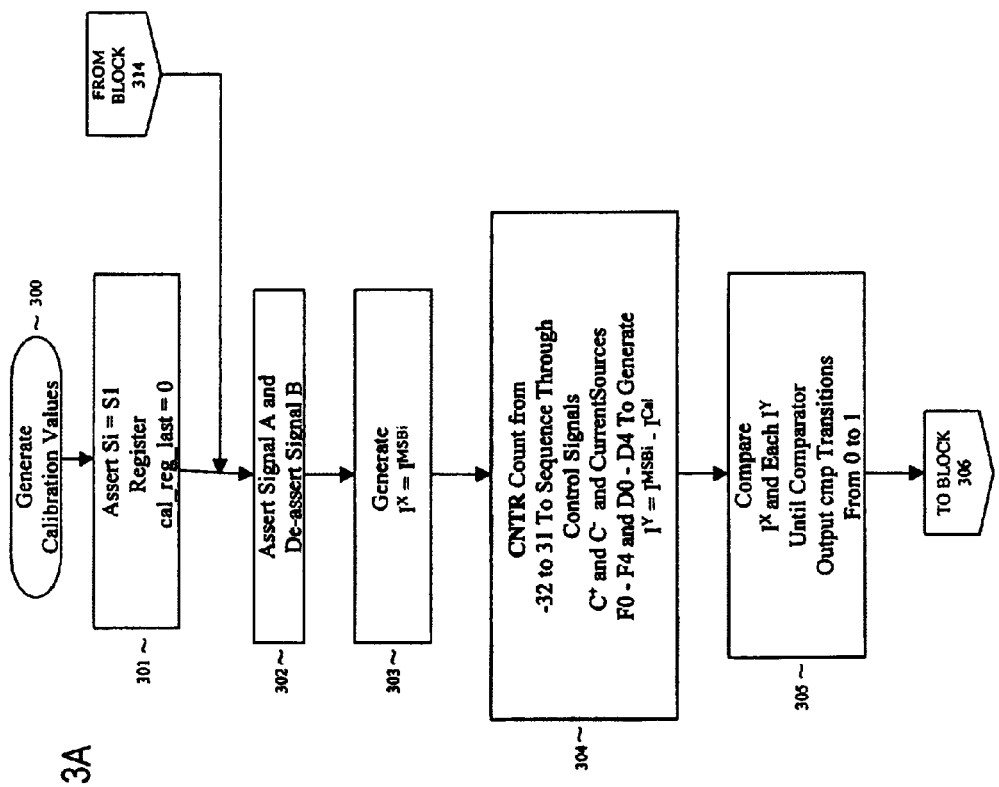
FIG. 3 is a flow chart describing the operation of the calibration logic shown in FIG. 2A during the generation of error compensation bits.
Figure 3B:
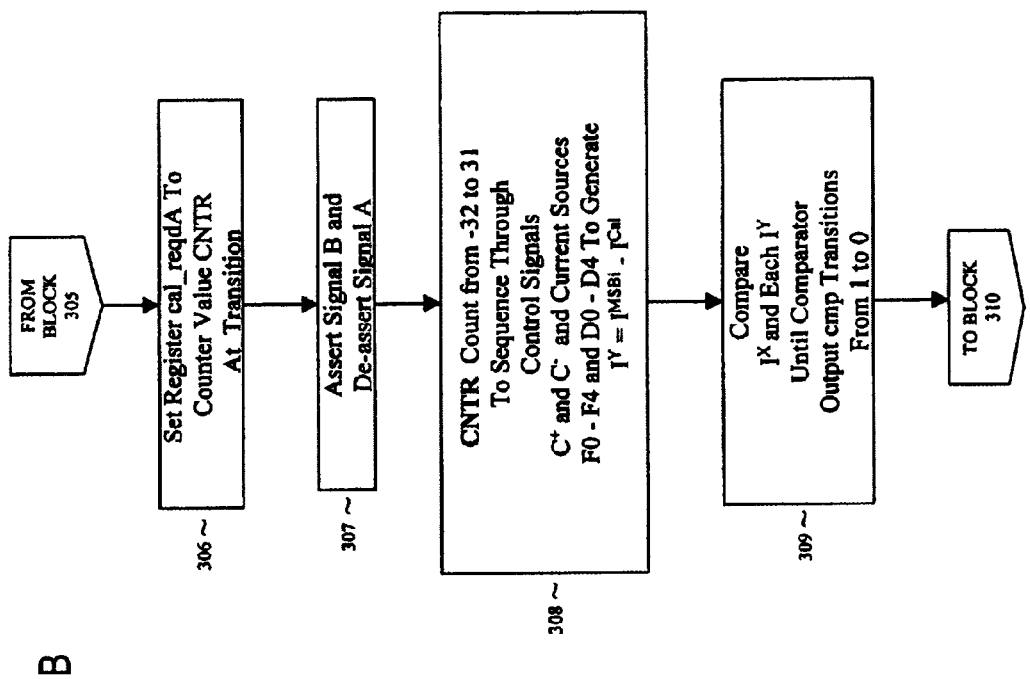
Figure 3C:
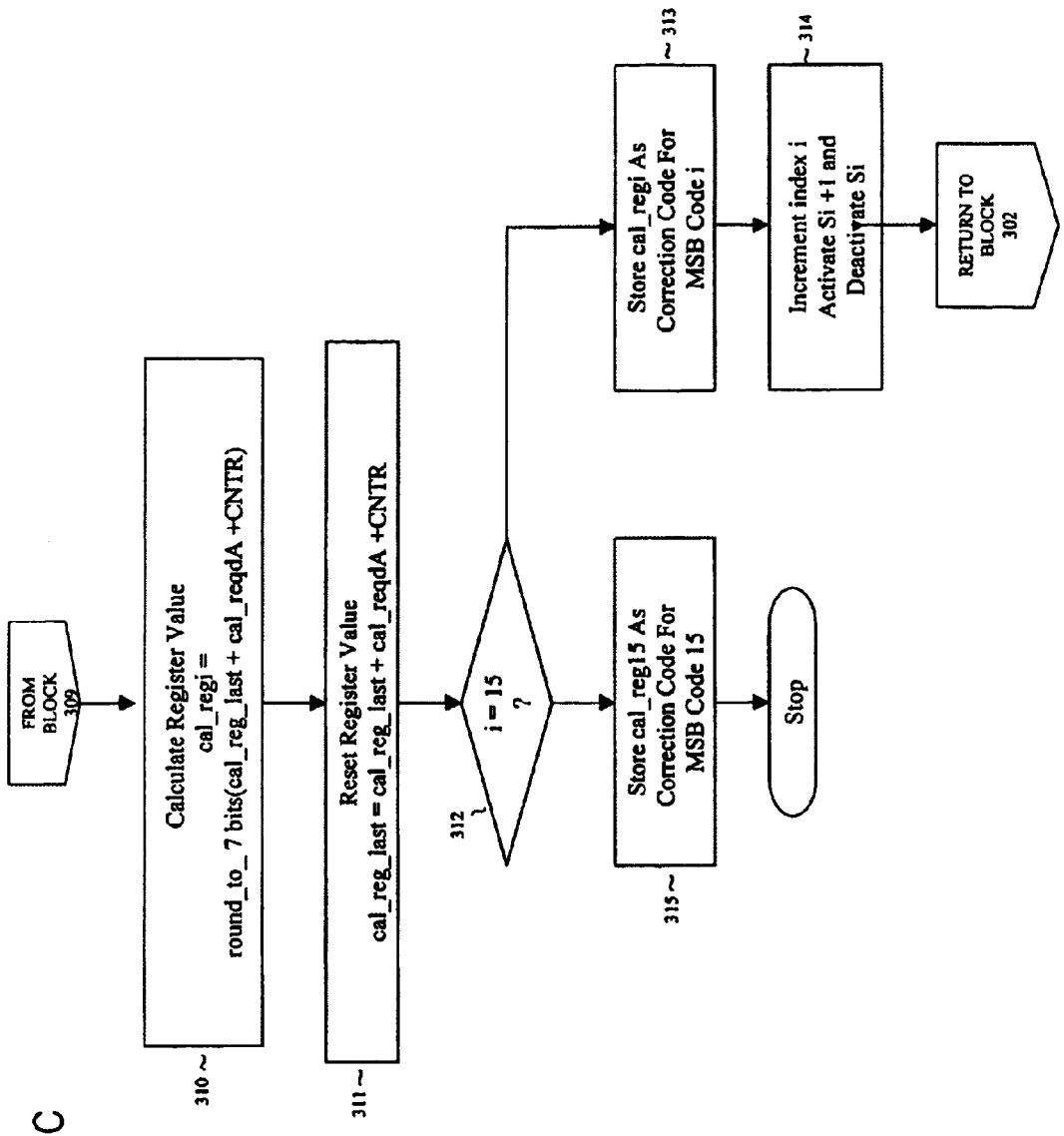

An electrical schematic of a representative cell structure 300, suitable for constructing either MSB unit cells UcellM or LSB unit cells UcellL, is shown in FIG. 3. In FIGS. 2 and 3, the designations i1 and i2 represent the current source/unit cell calibration control and data inputs, respectively, and the designations o1 and o1 represent the current source/unit cell calibration control and data outputs, respectively. As shown in FIG. 2B, each cell is represented by a current source 220, outputting a current xl, in which X is the current weight shown in FIG. 2A. During normal operations, the corresponding input bit at input i2 switches the current xl to the DAC 200 output lout of FIG. 2, through switch 222 and the output o2. During calibration, the current xl is switched by the complement of the input bit at input i2 through switch 221 and by the corresponding control signal at input i1 to the output o1. LSB unit cells UcellL, whose nominal value is equal to I/8, are constructed from MOSFETs having a reference channel width W and a reference channel length L, such that the lower ten (10) bits of DAC 200 have the required linearity without calibration. MSB unit cells UcellM forming MSB current sources 205a–205o are fabricated from MOSFETs each having a channel width to channel length ratio of (8W)/(L/2) to save overall chip area. In other words, the channel width to length ratio W/L for the UcellM transistors is sixteen (16) times the width to length ratio W/L of the UcellL transistors, although, the chip-area of each UcellM is just four (4) times that of UcellL, as the channel length L for UcellM transistors is half that of the channel length L for UcellL transistors.

MID segment 202 of FIG. 2A includes fifteen (15) current sources (L3–L17) 206a–206o, controlled by the fifteen (15) thermometer encoded input bits $X_{LM}(3)$–$X_{LM}(17)$ of FIG. 2C. These fifteen thermometer-encoded bits represent four (4) mid-range binary bits $D_{LSBM}$, also as shown in FIG. 2C. Each MID current source 206a–206o is fabricated from sixteen (16) LSB unit cells UcellL, and outputs a nominal current of 2l. During calibration, MID segment 203 current sources (L3–L17) 206a–206o are controlled by the C_AL control signal.

Segment 203 includes two (2) LSB current sources (L1–L2) 207a–207b respectively fabricated by eight (8) and four (4) LSB unit cells UcellL. During normal operation, LSB current sources 207a–207b are under the control of binary encoded bits $X_{LL}(3)$–$X_{LL}(4)$. Current sources 207a–207b output nominal currents of I and 1/2I, respectively. During calibration, LSB segment current sources (L1–L2) 207a–207b are controlled by the control signal Cal.

Segment 204 includes current sources (F0–F4) 208a–208e, which are controlled, during normal operation, by binary encoded bits $x_{LL}(2)$–$x_{LL}(1)$ and $X_F(1)$–$X_F(2)$. current sources 208a–208e are fabricated from two (2), one (1), one-half (0.5), one-quarter(0.25) and one eighth (0.125) LSB unit cells UcellL, respectively. Current sources 208a–208e output nominal currents of I/4, I/8, I/16, I/32, and I/64. During calibration, segment current sources (F0–F4) 208a–208e are controlled by the $c^+(0)$–$c^+(4)$ control signals.

First MSB current source (M1) 205a, which nominally outputs a current of 32I, includes six (6) sub-current sources (E1–E6) 209a–209f outputting a nominal currents of I/32, I/16, I/8, I/4, I/2, I in response to binary weighted bits $E^-(1)$–$E^-(6)$, and a current source 210, which outputs a nominal current of 30I in response to thermometer encoded bit $X_M(1)$, during normal operation. Current source (E0) 211, controlled by binary bit $E^-(0)$, allows DAC 200 to operate with two's complement data inputs, without the need of digital adder logic, as discussed further below.

Calibration current sources (D1–D6) 212b–212g provide weighted currents of I, I/2, I/4, I/8, I/16, I/32 in response to the control signals $E^+(1)$–$E^+(6)$ during normal operation. During calibration, the $C^-(0)$–$C^-(4)$ control signals control calibration current sources D0–D4 212a–212e. A current source 213 (Dext), having a current weight of I/64 is provided for two's complement operations under control of the C-EXT control signal during normal operation.

During the calibration routine discussed below, current mirror 214 and current comparator 215 compare the current $I^X$, which is the current $I^{MSBi}$ from the active current source (M1–M15) 205a–205o, during a corresponding calibration iteration, as selected by the corresponding control signal s1–s15, with the current $I^Y$. $I^Y$ is nominally equal to the sum of the calibration current $I^{CAL}$ and the currents $I^{lsbs}$, from MID current sources (L3–L17) 206a–206o, LSB current sources (L1–L2), fractional current sources 208a–208e, and a dummy current source 217. Dummy current source 217 ensures that, nominally, $I^{lsbs}$ is equal to the nominal $I^{msb}$ current of 32I.

Calibration logic 216 receives the output of current comparator 214 CMP, the Cal calibration control signal, a test signal CAL_DIS_TEST, and the CLK_CAL calibration clock signal. During calibration, calibration logic 216 generates the s1–s15, $E^-(1)$–$E^-(6)$, $E^+(0)$–$E^+(6)$, $C^-(0)$–$C^-(4)$, $C^+(0)$–$C^+(4)$, A, B, and $C^-$(extra) control signals.

Calibration generally proceeds as follows. One particular routine for performing calibration is discussed in detail below in conjunction with FIG. 4. For each control signals s1–s15, the current $I^X$ is generated by activating the corresponding MSB current source 205a–205o. Current mirror 214 and current comparator 215 then compare the currents $I^X$ and $I^Y$. If the current $I^X$ is greater than the current $I^Y$, one or more current sources (D0–D4) 212a–212e are turned on with the control signals $C^-(0)$–$C^-(4)$ to make the $I^X$ and $I^Y$ currents nominally equal. Alternatively, if the current $I^X$ is less than the current $I^Y$, one or more of current sources (F0–F4) 208a–208e are turned off, by selectively deactivating the control signals $C^+(0)$–$C^+(4)$, to make the currents $I^X$ and $I^Y$ nominally equal. The correction required for the current control signal s1–s15 is determined from two such readings of the currents $I^X$ and $I^Y$, by swapping the current mirror 214 inputs using switches A and B, and taking the average of the two readings, CAL_REQD$_i$ in which i is an index from 1 to 15. The two readings cancel any mirror mismatch within current mirror 214 and comparator offset within current comparator 215. Advantageously, the calibration control signals $C^-(0)$–$C^-(4)$ and $C^+(0)$–$C^+(4)$, need not be latched, as the settled values of the currents $I^X$ and $I^Y$ are the only values of importance.

This process is repeated for until all current sources have s1–s15 have been tested, to derive correction values for all permutations of the four (4) binary input MSBs, D$_{MSB}$. Total error correction required for any four-bit MSB binary code with index i=1 to 15 is stored in a calibration register CAL_REG$_i$. Advantageously, the values of CAL_REG$_i$ are pre-computed during calibration phase, such that no real-time-computation of correction values is needed during normal operation. Subsequently, during normal operation, current sources (D6 to D1) 212a–212f and current sources (E1–E6) 209a–209f are used to correct for the –ve and +ve errors as per data stored in the calibration register CAL_REG$_i$ utilizing the E+ and E– control signals.

FIG. 3 is a flow chart illustrating a representative procedure 300 for generating the calibration values generally described above. At block 301, for the first binary MSB value, with index i, i=1 to 15, the control signal S1 is activated. In other words, control signal S1 is active and control signals S2–S15 are inactive. Consequently, MSB current source 205a of FIG. 2 is on and providing the current $I^X$, and MSB current sources 205b–205o are off. Additionally, for the first MSB input bit, the register cal_reg_last is cleared, at Block 301.

At block 302, switch A of current mirror 214 is closed and switch B is opened, for the first of the two calibration measurements to be performed for the first current source 205a. At block 303, the current $I^X$ is generated from current source 201a activated by the asserted control signal S1.

A counter, timed by the signal CLK_CAL of FIG. 2A, starts to count from –32 to 31 to sequence the assertion of the control signals $C^+(0)$–$C^+(4)$ and $C^-(0)$–$C^-(4)$. With each count, the new set of asserted control signals $C^+(0)$–$C^+(4)$ and $C^-(0)$–$C^-(4)$ activate a new combination of fractional bit current sources 208a–208d and/or calibration current sources 212a–212d to generate a new value of current $I^Y$. For example, when the current counter value CNTR is minus thirty-two (–32), all fractional current sources (F0–F4) 208a–208e and all calibration current sources (D0–D4) 212a–212d are on and contributing to the current $I^Y$. When the current counter value CNTR is zero (0), all fractional current sources (F0–F4) 208a–208e are turned-on, but all calibration current sources (D0–D4) 212a–212d are turned-off. Finally, when the current counter value CNTR is plus thirty-one (31), then all fractional current sources (F0–F4) 208a–208e are turned-off and all calibration current sources (D0–D4) 212a–212d are turned-off.

With each new current $I^Y$ generated, a comparison is made at block 305 with the current $I^X$, until the output of comparator 215 transitions from a logic zero (0) to a logic one (1). At the transition point of the output of comparator 215, the currents $I^X$ and $I^Y$ are nominally equal. Therefore, at block 306, a register CAL_REQA is set to the counter value CNTR at the transition point, which represents the number of half LSBs of correction current required in the current $I_{MSBi}$.

Next, a second set of measurements between the currents $I^X$ and $I^Y$ commences at block 307, at which point the switch A opens and switch B closes to reverse the inputs into current mirror 214. The process described above in regard to blocks 304 and 305 is then repeated at blocks 308 and 309, with the exception that the transition point is detected when the output of comparator 215 transitions from a logic one (1) to a logic zero (0).

At block 310, the register value CAL_REG$_1$ is calculated as:

CAL_REG$_1$=round_to__7bits(CAL_REG_LAST+CAL_REQD$A$+(CNTR)), in which CAL_REG_LAST, for the first iteration is zero (0), as set at block 301, COR_REQDA is the register value set at block 306, and CNTR is the counter value at the transition at block 309.

The register value CAL_REG_LAST is reset at block 311, for the next iteration, as:

CAL_REG_LAST=CAL_REG_LAST+CAL_REG$A$+CNTR.

For current source Si, the CAL_REG_LAST register stores a value representing the accumulated error for all previously calibrated current sources up to current source Si-1. The running value in the CAL_REG_LAST register is stored at full precision, to reduce error accumulation as calibration procedure 300 iterates from current source S1 to current source S15. The correction values for each input MSB are stored in the CAL_REG(I) register with a lower precision, preferably by rounding the lower two (2) LSBs, as per overall performance goals.

If at decision block 312 the index i has not reached fifteen (15), then at block 313, the current value of CAL_REG$_i$ is taken and stored in register as the correction code for binary MSB input code i. At block 314, the index i is incremented and the next MSB current source 205a–205o is activated by the corresponding control signal S1–S15. The current source or sources 205a–205o for the just-completed iteration is deactivated. Procedure 300 returns to block 302 for the next iteration.

If at decision block 312, the index i has reached fifteen (15), then the value CAL_REG15 is stored at the correction could for MSB input code fifteen (15) and procedure 300 is complete.

Figure 4:
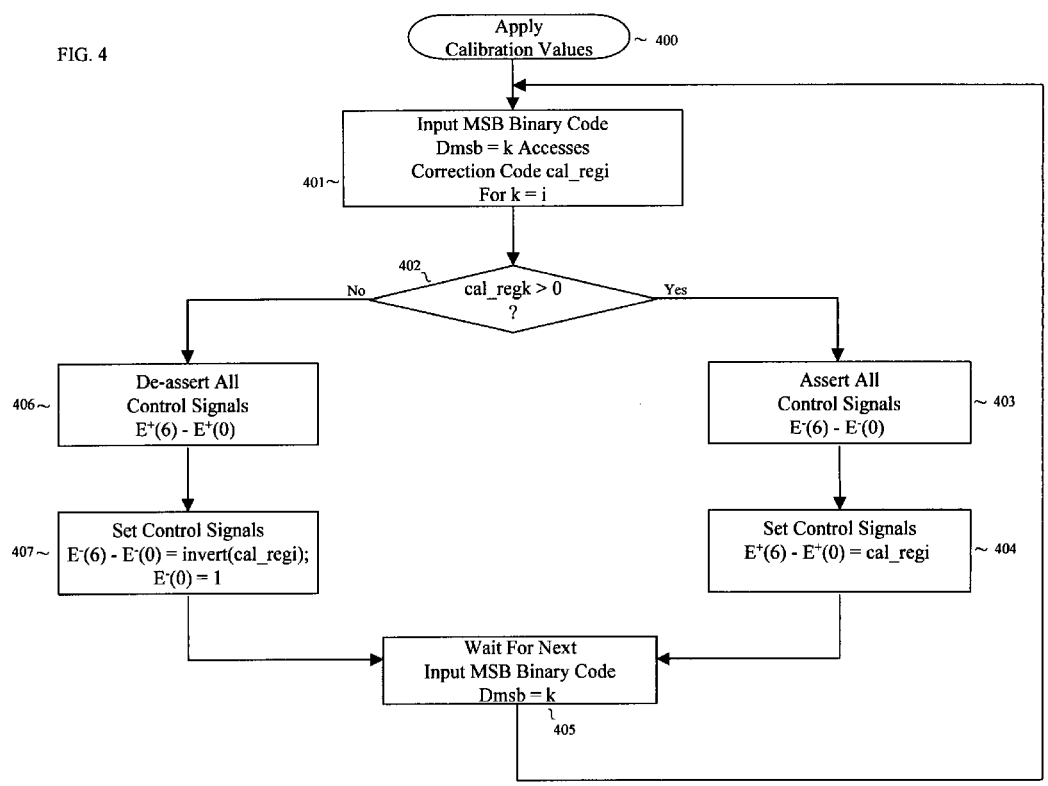
FIG. 4 is a flow chart illustrating the operation of the calibration logic shown in FIG. 2A during the application of the compensation bits generated in FIG. 3 to correct errors during the normal operation of the DAC shown in FIG. 2A.

FIG. 4 is a flow chart illustrating a preferred procedure 400 which describes the correction operations dynamically performed by calibration logic 216 of FIG. 2A during normal mode operations of DAC 200 of FIG. 2A. At block 401, the current four-bit bit MSB code D$_{MSB=K}$, prior to thermometer-encoding, accesses the corresponding correction code CAL_REGK from register CAL_REG$^K$, in which k=i, as previously determined by procedure 300 described above in conjunction with FIG. 3.

At block 402 a determination is made as to whether the value CAL_REGK is greater than zero (0), which indicates that positive correction is needed by adding an appropriate number of current sources. If is greater than zero (0), then at block 403, the signals E$^-$(0)–E$^-$(6) are all asserted, such that a current sub-elements 209a–209f turn-on. At block 404 control signals E$^+$(1)–E$^+$(6) are asserted to equal the bits of correction code CAL_REGK to turn-on the corresponding correction current sources 212a–212f. As a result, CAL_REGK number of LSB unit currents are added to the output I$_{OUT}$ of FIG. 2. At block 405, calibration logic 216 waits for the next input word D$_{msb}$.

If the correction code CAL_REGK is lesser than or equal to zero (0) at block 402, then at block 406 the control signals E$^+$(1)–E$^+$(6) are all de-asserted and all calibration current sources 212a–212f turn-off. At the same, time the signals E$^-$(0)–E$^-$(6) are asserted equal to the bits of CAL_REGK to deactivate a corresponding number of sub-current sources 209a–209f. In this case, a current of CAL_REGK number LSB unit currents are subtracted from the output Iout. Advantageously, 2's complement operation is achieved without adder logic utilizing current source (E0) 211. At block 403, calibration logic 216 waits for the next input word.

The principles of the present invention realize a number of significant advantages. For example, the only analog circuitry required to implement the calibration circuitry is a very low-complexity current mirror—current and comparator circuitry. In other words, no operational amplifier or switched-capacitor circuits are necessary. Additionally, the implementation of the correction and calibration reuses most of the existing current sources in the DAC thereby minimizing chip area. This feature is unlike the known art in which dedicated correction DACs are utilized for every current source which is calibrated. Furthermore, the straightforward incrementation approach to calibration simplifiers the digital design. Also, in the illustrated embodiment discussed above, the need to latch calibration related control signals is eliminated, which additionally saves chip area.

Advantageously, the pre-calculation and storage of correction values for the MSB codes are performed directly prior to normal operation of DAC 200, instead of on an individual MSB current source basis, which eliminates the need to perform complex real-time correction computations. Also, in the illustrated embodiment, the conventional adder logic normally required for 2's complement operation is eliminated using extra current source (E0) 211, which improves the speed of operation and saves chip area. The inventive principles may be applied to any conventional segmented DAC. Finally, the calibration circuitry discussed above may be shared across several DACs on chip, if needed.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A current steering digital to analog converter comprising:
   a current source for selectively providing a selected amount of current to an output in response to input data and including a selected number of sub-current sources for selectively providing fractions of the selected amount of current to the output;
   compensation current sources each for providing a selected amount of compensation current to the output; and
   compensation control circuitry operable in response to the input data to selectively activate and de-activate selected ones of the sub-current sources and the compensation current sources in response to a stored compensation value indexed by the input data to provide current compensation at the output.

2. The current steering digital to analog converter of claim 1, wherein the compensation control circuitry is operable to:
   activate the sub-current sources and selected ones of the compensation current sources to add a corresponding amount of compensation current to the output; and
   deactivate the compensation current sources and selected ones of the fractional current sources to subtract a corresponding amount of compensation current from the output.

3. The digital to analog converter of claim 1, wherein the current source is one of a set of current sources forming a first current source segment responsive to a first set of the input bits in a normal mode, the digital to analog converter further comprising:
   a second current source segment including set of current sources each for providing a corresponding amount of current to the output in the normal mode and forming a second segment; and
   calibration logic for generating the stored compensation value during a cycle of calibration mode and operable to:
   activate a current source of the first segment to generate a current being calibrated;

sequentially activate and deactivate the compensation current sources and the current sources of the second segment to generate a sequence of calibration currents;

compare the current being calibrated and the sequence of calibration currents until a transition point is reached at which the current being calibrated and one of the sequence of calibration currents match; and generate the compensation value from a representation of the activated and deactivated compensation current sources and current sources of the second segment at the transition.

4. The digital to analog converter of claim 3, wherein the calibration circuitry comprises a counter for sequentially activating and deactivating the compensation current sources and current sources of the second segment, the counter operable to:

activate all current sources in the second segment and all of the compensation current sources in response to a maximum negative count value;

activate all current sources in the second segment and deactivate all of the compensation current sources in response to a zero count value; and deactivate all current sources in the second segment and all of the compensation current sources in response to a maximum positive count value.

5. The digital to analog converter of claim 3, wherein the calibration circuitry generates the compensation value from a count at the transition point.

6. The digital to analog converter of claim 5, wherein the calibration circuitry is further operable during the cycle of the calibration mode to:

activate and deactivate selected ones of the compensation current sources and the current sources of the second segment to generate a second sequence of calibration currents;

compare the calibration current and at least one of the second sequence of calibration currents to detect a second transition point at which the calibration current and one of the second sequence of calibration currents match; and generate the compensation value from a count at the second transition point and the count at the transition point.

7. The digital to analog converter of claim 3, wherein the calibration logic is further operable during a second cycle of the calibration mode to:

activate a second current source of the first segment to generate a second calibration current;

sequentially activate and deactivate the compensation current sources and the current sources of the second segment to generate a second sequence of calibration currents;

compare the second calibration current and at least one of the second sequence of calibration currents to detect a second transition point at which the second calibration current and one of the second sequence of calibration currents match; and generate a second compensation value the compensation value and a representation of the activated and deactivated compensation current sources and current sources of the second segment at the second transition point.

8. The digital to analog converter of claim 1, further comprising a current source for providing a fraction of the selected amount of current to the output during two's complement operations.

9. A method of compensating for errors in a current steering digital to analog converter including conversion current sources for selectively providing currents to an output during conversion data, one conversion current source formed from a set of sub-current sources for providing fractions of an amount of current to the output, and compensation current sources each for providing a selected amount of compensation current to the output, comprising:

selectively activating and deactivating in response to a stored compensation value indexed by the input data selected ones of the sub-current sources and the compensation current sources to provide current compensation at the output during conversion of the input data.

10. The method of compensating of claim 9, wherein activating and deactivating selected ones of the sub-current sources and the compensation current sources comprises:

activate the sub-current sources and selected ones of the compensation current sources to add a corresponding amount of compensation current to the output; and deactivate the compensation current sources and selected ones of the fractional current sources to subtract a corresponding amount of compensation current from the output.

11. The method of compensating of claim 9, further comprising:

generating the compensation value during a calibration cycle comprising: activating one of the conversion current sources to generate a calibration current;

sequentially activating and deactivating the compensation current sources and other conversion current sources to generate a sequence of calibration currents;

comparing the calibration current and the sequence of calibration currents until a transition point is reached at which the calibration current and one of the sequence of second calibration currents match; and generating the compensation value from data representing of the activated and deactivated compensation current sources and other conversion current sources at the transition.

12. The method of compensating of claim 11, wherein sequentially activating and deactivating a set of compensation current sources and another current sources comprises:

activating all of the other current sources and all of the compensation current sources in response to a maximum negative count value;

activating all of the other current sources and deactivating all of the compensation current sources in response to a zero count value; and deactivating all of the other current sources and all of the compensation current sources in response to a maximum positive count value.

13. The method of compensating of claim 11, further comprising:

activating and deactivating the compensation current sources and the other conversion current sources to generate a second sequence of calibration currents;

comparing the calibration current and at least one of the second sequence of calibration currents to detect a second transition point at which the calibration current and one of the second sequence of calibration currents match; and generating the compensation value from a data a representing the activated and deactivated compensation current sources and the other conversion current sources at the transition and data a representing the activated and deactivated compensation current sources and the other conversion current sources at the second transition.

14. The method of compensating of claim 9, further comprising:
   activate a second conversion current source to generate a second calibration current;
   sequentially activate and deactivate the compensation current sources and the other conversion current sources to generate a second sequence of calibration currents;
   compare the second calibration current and at least one of the second sequence of calibration currents to detect a second transition point at which the second calibration current and one of the second sequence of calibration currents match; and
   generate a second compensation value representing a second value of the input bits from the compensation value and a representation of the activated and deactivated compensation current sources and current sources of the second segment at the second transition point.

15. A segmented current steering digital to analog converter comprising:
   a most significant bit segment including a set of current sources for generating output currents at a converter output in response to a plurality of most significant input bits received during data conversion, at least one of the current sources of the most significant bit segment including a set of sub-current sources for providing fractional output currents;
   a least significant bit segment including a set of current sources for generating output currents at the converter output in response to least significant bits received during data conversion;
   a set of compensation current sources for providing error compensation at the converter output during data conversion;
   calibration circuitry for generating and storing a set of output current compensation values during a calibration procedure by comparing a current from the most significant bit segment with a current generated by the least significant bit segment and the set of compensation current sources; and
   compensation control circuitry for activating and deactivating selected ones of the sub-current sources and the compensation current sources to provide current compensation at the output in response to a stored compensation value indexed by the most significant input bits.

16. The digital to analog converter of claim 15, wherein the most significant input bits are thermometer encoded and the least significant input bits are binary encoded.

17. The digital to analog converter of claim 15, further comprising compensation control circuitry operable to:
   activate each of the sub-current sources and selected ones of the compensation current sources to add a corresponding amount of compensation current to the output; and
   deactivate the compensation current sources and selected ones of the fractional current sources to subtract a corresponding amount of compensation current from the output.

18. The digital to analog converter of claim 15, further comprising calibration circuitry for generating the stored compensation value during a cycle of calibration mode and operable to:
   activate a current source of the most significant bit segment to generate a calibration current;
   sequentially activate and deactivate the compensation current sources and selected current sources of the least significant bit segment to generate a sequence of calibration currents;
   compare the calibration current and the sequence of calibration currents to detect a transition point at which the calibration current and one of the sequence of calibration currents match; and
   generate a compensation value from a representation of the activated and deactivated compensation current sources and current sources of the second segment at the transition and from data representing of the activated and deactivated compensation current sources and current sources of the second segment at the second transition.

19. The digital to analog converter of claim 15, wherein the calibration circuitry generates the output current compensation values utilizing full-precision intermediate values to reduce error accumulation and stores the set of output current compensation values utilizing a lesser precision.

20. The digital to analog converter of claim 15, further comprising at least one additional current source for eliminating addition operations during two's complement operations.

21. A method of performing digital to analog conversion comprising:
   generating a first set of output currents at a converter output in response to a plurality of received most significant input bits during data conversion, at least one of the first set of output currents generated from a plurality of fractional output currents;
   generating a second set of output currents at the converter output during data conversion in response to received least significant input bits;
   providing error compensation at the converter output during data conversion with a set of compensation currents;
   generating and storing a set of output current compensation values during calibration by comparing a current from the first set of output currents with a current from the second set of output currents and the set of compensation currents; and
   selectively adding and subtracting current at the output in response to a stored compensation value indexed by the most significant input bits.

22. The method of claim 21, wherein the most significant input bits are thermometer encoded and the least significant input bits are binary encoded.

23. The method of claim 21, further comprising:
   providing each of the fractional output currents and selected ones of the compensation currents to the output to add a corresponding amount of current to the output; and
   turning-off each of the fractional output currents and selected ones of the compensation currents to the output to subtract a corresponding amount of current to the output.

24. The method of claim 21, further comprising generating the stored compensation value during a cycle of calibration mode:
   selecting a current from the first set of currents as a calibration current;
   sequentially providing and turning-off the compensation currents and selected currents of the second set of currents to generate a sequence of calibration currents;

comparing the calibration current and the sequence of calibration currents to detect a transition point at which the calibration current and one of the sequence of calibration currents match; and generating a compensation value from a representation of activated and deactivated compensation currents and currents of the second set of currents at the transition and from data representing of the activated and deactivated compensation currents and current of the second set of currents at a second transition.

* * * * *